United States Patent
Unterricker

(10) Patent No.: US 6,411,139 B1
(45) Date of Patent: Jun. 25, 2002

(54) FREQUENCY DOUBLING CIRCUIT

(75) Inventor: Reinhold Unterricker, Vaterstetten (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/917,556

(22) Filed: Jul. 27, 2001

(30) Foreign Application Priority Data

Jul. 27, 2000 (DE) .......................................... 100 36 722

(51) Int. Cl.$^7$ ............................................... H03B 19/00
(52) U.S. Cl. ........................................ 327/122; 327/116
(58) Field of Search ........................... 27/116, 119, 122, 27/355, 356

(56) References Cited

U.S. PATENT DOCUMENTS

| | | | | |
|---|---|---|---|---|
| 4,588,981 A | * | 5/1986 | Senn | 341/143 |
| 4,864,590 A | * | 9/1989 | Arnon et al. | 333/18 |
| 5,225,835 A | * | 7/1993 | Majima et al. | 341/31 |
| 5,345,233 A | * | 9/1994 | Nagata et al. | 341/76 |
| 5,621,408 A | * | 4/1997 | Cake et al. | 341/143 |
| 6,107,876 A | * | 8/2000 | O'Brien | 330/10 |

FOREIGN PATENT DOCUMENTS

DE  2 212 911  9/1973

* cited by examiner

*Primary Examiner*—Kenneth B. Wells
*Assistant Examiner*—Cassandra Cox
(74) *Attorney, Agent, or Firm*—Laurence A. Greenberg; Werner H. Stemer; Ralph E. Locher

(57) ABSTRACT

A frequency doubling circuit includes an exclusive OR gate which is supplied with an input signal and also with an integrated and quantized version of the input signal. The exclusive OR gate provides an output signal having twice the frequency of the input signal. A weighted adder is provided between an integrator and a quantizer of the frequency doubling circuit. The weighted adder adds the weighted input signal to the integrated signal. Despite runtime effects in the quantizer, the output signal has an undistorted impulse-pause ratio of 1 to 1. The frequency doubling circuit thereby maintains the phase position of the input signal, so that it is suitable for data bus applications with high clock rates or high data rates.

7 Claims, 2 Drawing Sheets

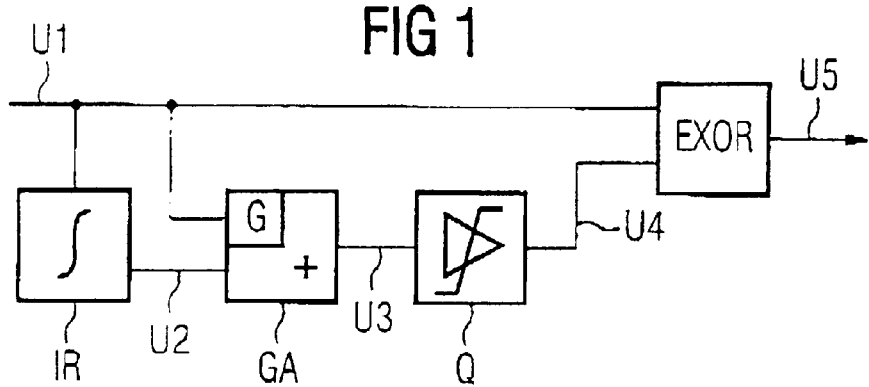
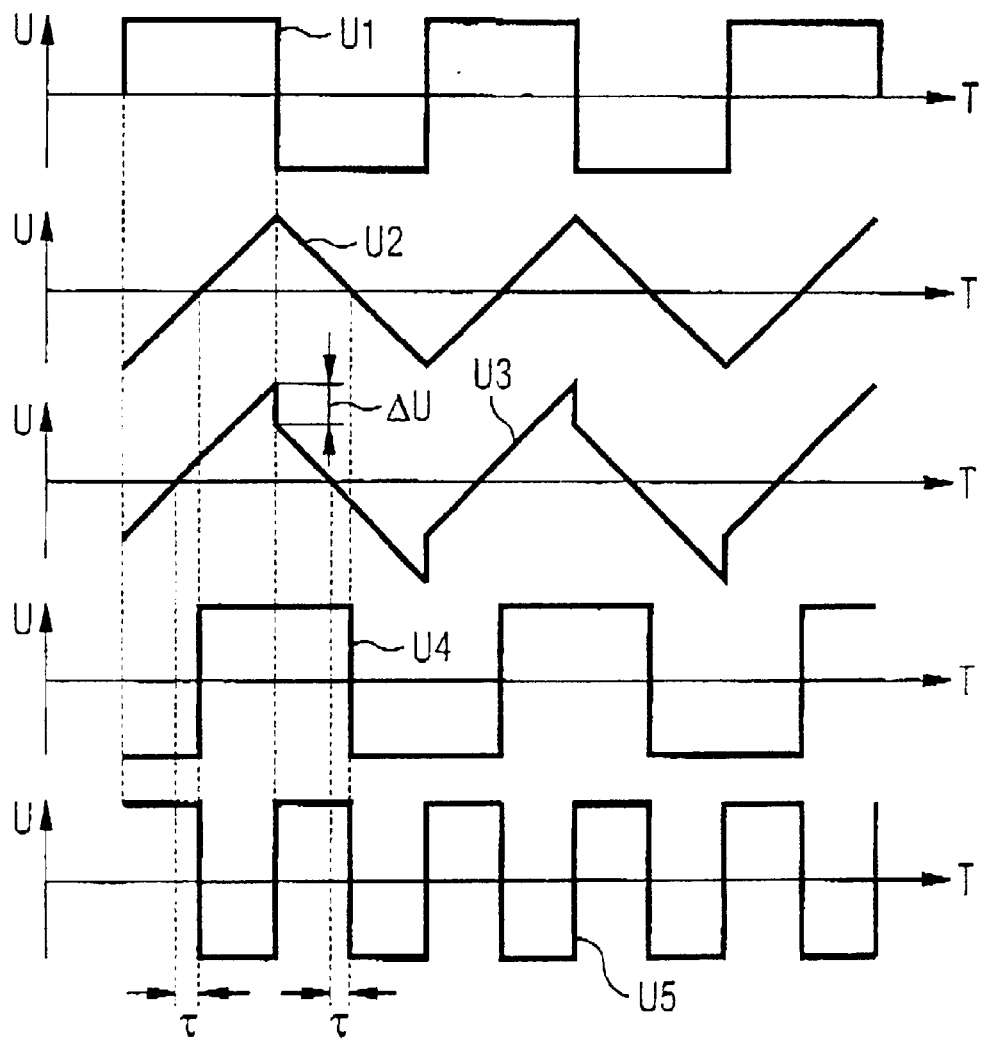

FREQUENCY DOUBLING CIRCUIT

BACKGROUND OF THE INVENTION

Field of the Invention

The present invention relates to a frequency doubling circuit having an integrator to which an input signal having a given frequency can be supplied, and at whose output an integrated signal is provided. The frequency doubling circuit also has a quantizer at whose output a quantized signal derived from the integrated signal is provided, and has an exclusive OR gate to which the input signal can be supplied at a first input thereof and to which the quantized signal can be supplied at a second input thereof, and at whose output an output signal having twice the frequency of the input signal is provided.

Circuits that generate a signal having twice the frequency of a provided signal are for example required for a data transmission on a data bus in which a clock signal having half the data rate is provided. In this context, receiver circuits can be provided that, for further processing, derive from the received clock signal having half of the data rate a clock signal having the frequency of the full data rate.

A known frequency doubling circuit of this type is shown in FIG. 3. Here, an input signal U1 having a frequency that is to be doubled is supplied to an exclusive OR gate directly in an unmodified form on the one hand, and in integrated, quantized form on the other hand. An integration and a subsequent quantization generate, at the output of the quantizer Q, a signal U4* that is phase-shifted by 90° in relation to the input signal U1. At the output of exclusive OR gate EXOR, an output signal U5* having twice the frequency of the input signal can be derived.

A frequency doubling circuit of this type is described for example in published, Non-Prosecuted German Patent Application No. DE 22 129 11 A.

However, in real frequency doubling circuits according to FIG. 3, there is the problem that in particular the quantizer Q has a signal runtime or delay that has the effect that the signal that is to be phase-shifted by 90° is in fact shifted by a larger phase angle. The additional, undesired phase shift is disturbing particularly at high operating frequencies, because here even small delays correspond to large phase angles. The consequence of the additional phase shift is that the frequency-doubled output signal has a distorted impulse-pause ratio, as is shown in FIG. 4 for output signal U5*.

The described problem can be solved by emulating the signal runtime or signal delay of the quantizer with an equally large additional runtime in the path of the input signal at the input side at the exclusive OR gate. However, this has the disadvantage that a clock signal generated in this way no longer has the correct phase with respect to the data signals coming into a receiver. Here, all incoming data signals would have to be delayed by the same phase angle, which, in particular given broad data buses of for example 64 bits, and high data rates such as for example 1 gigabit/second, results in an increased outlay, requires a large chip surface, and increases power loss.

SUMMARY OF THE INVENTION

It is accordingly an object of the invention to provide a frequency doubling circuit which overcomes the above-mentioned disadvantages of the heretofore-known frequency doubling circuits of this general type and which avoids a distortion of the impulse-pause ratio while maintaining the phase position of the clock signal.

With the foregoing and other objects in view there is provided, in accordance with the invention, a frequency doubling circuit, including:

an integrator configured to receive an input signal having a first frequency, the integrator having an integrator output and providing an integrated signal at the integrator output;

an adder connected to the integrator and configured to receive the input signal and the integrated signal, the adder having an adder output and providing a summed signal at the adder output;

a quantizer connected to the adder and having a quantizer output, the quantizer receiving the summed signal, deriving a quantized signal from the summed signal and providing the quantized signal at the quantizer output; and an exclusive OR gate having a first input, a second input and an output, the exclusive OR gate receiving the input signal at the first input and receiving the quantized signal at the second input, and providing an output signal having a second frequency, the second frequency being double the first frequency.

In other words, the frequency doubling circuit according to the invention includes:

an integrator to which an input signal having a first frequency can be supplied and at whose output an integrated signal is provided;

a quantizer at whose output a quantized signal derived from the integrated signal is provided;

an exclusive OR gate to which the input signal can be supplied at a first input, and to which the quantized signal can be supplied at a second input, and at whose output an output signal having twice the frequency of the input signal is provided; and an adder to which the input signal and the integrated signal can be supplied at the input side, and at whose output the quantizer is connected for supplying a summed signal to the quantizer.

The introduction of an additional adder between the integrator and the quantizer has the advantage that the phase position of the input signal is not influenced by additional runtime effects. In addition, through suitable addition of the input signal to the integrated input signal, the signal delay is compensated by runtime effects in the quantizer. At the output of the exclusive OR gate, an output signal is provided that has twice the input signal frequency and that has a symmetrical impulse-pause ratio. Advantageously, no additional runtime delays or phase shifts occur in the input signal path. The described frequency doubling circuit can be realized with a low chip surface requirement and can be operated with a low power loss. Moreover, the described frequency doubling circuit is suitable for high data rates.

In an advantageous embodiment of the present invention, the adder has a weighting unit for weighting the input signal. The summed signal is thereby formed from the weighted input signal and the integrated signal. Using a weighted adder, a compensation of these runtime effects that is adapted precisely to the runtime delay of the quantizer is possible through weighted addition. The weighting factor is thereby dependent on the one hand on the runtime delay in the quantizer and on the other hand on the integration time constant of the integrator. Through the weighted addition of the input signal to the integrated signal, in the output signal of the adder, the summed (added) signal is shifted both in its rising and also in its falling edge in such a way that the runtime caused by the quantizer is compensated, and the output signal has an undistorted and symmetrical impulse-pause ratio of 1 to 1. In addition to the runtime of the quantizer, other runtime effects, for example in the integrator, in logical gates or on lines can of course also be taken into account and correspondingly compensated.

In a further advantageous embodiment of the present invention, the integrator is an RC low-pass filter. Because in the specified circuit configuration only low demands are made on the precision of the integration in the integrator, the integrator can be realized simply as an RC low-pass filter.

In a further advantageous embodiment of the present invention, the quantizer is a limiting amplifier. A limiting amplifier, which allocates a value-discrete output signal to a value-continuous input signal, can be realized in a simple fashion. The limiting amplifier can thereby be configured such that the quantized signal can assume only two discrete states, namely a logical zero or a logical one.

In a further advantageous embodiment of the present invention, the quantizer provides a logical one at its output if the voltage of the summed signal is greater than or equal to zero, and provides a logical zero if the voltage of the summed signal is less than zero. The voltage of the summed signal is here related to the AC component of this voltage. Of course, the summed signal can also include a DC component.

According to another feature of the invention, the weighting unit weights the input signal such that zero transitions of the summed signal are shifted for compensating runtime effects in the quantizer.

According to yet another feature of the invention, the weighting unit weights the input signal such that zero transitions of the summed signal are shifted for compensating a sum of runtime effects in the integrator, in the quantizer, and in the exclusive OR gate.

Other features which are considered as characteristic for the invention are set forth in the appended claims.

Although the invention is illustrated and described herein as embodied in a frequency doubling circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block circuit diagram of an exemplary frequency doubling circuit according to the invention;

FIG. 2 is graph for illustrating the voltage curves of the signals of the frequency doubling circuit of FIG. 1;

DESCRIPTION OF THE PREFERRED EMBODIMENTS

Referring now to the figures of the drawings in detail and first, particularly, to FIG. 1 thereof, there is shown a frequency doubling circuit having an integrator IR, which can be supplied at its input with a rectangular periodic input signal U1 having a frequency that is to be doubled, and at whose output an integrated signal U2 can be derived.

Downstream from integrator IR there is connected a weighted adder GA, to which input signal U1 can be supplied at one input and integrated signal U2 can be supplied at another input. The weighted adder has a weighting unit G for weighting input signal U1. At the output of weighted adder GA, a summed signal U3 can be derived that corresponds to the sum of integrated signal U2 and a product of input signal U1 and a weighting factor. Summed signal U3 can be quantized using a quantizer Q, at whose output a quantized, value-discrete signal U4 can be derived. This quantized signal U4, as well as input signal U1, can each be supplied to an input of an exclusive OR gate EXOR, at whose output desired output signal U5 is provided, having twice the frequency of the input signal. Quantized signal U4 and input signal U1 are thereby phase-shifted by 90° to one another.

The functioning of the circuit according to FIG. 1 becomes clear from the graph of FIG. 2 which shows voltages U of the signal curves of signals U1 to U5 over time T. Here, U1 designates the input signal, U2 designates the integrated signal, U3 designates the summed signal, U4 designates the quantized signal, and U5 designates the output signal. Signal U1 is a rectangular signal having an undistorted impulse-pause ratio of 1 to 1. Input signal U1 is integrated in integrator IR, so that integrated signal U2, which has a triangular or saw tooth voltage, is provided at the output of integrator IR. After each half clock phase, the summed signal U3 exhibits a voltage jump of an amount $\Delta U$. This is because input signal U1, weighted with a weighting factor, is added to integrated signal U2. Due to the described weighted addition, summed signal U3 has zero transitions of the depicted AC component of the signals, which are shifted to the left on the time axis.

The shift of the zero transitions, both in the falling and also in the rising edge of summed signal U3, thereby respectively takes place by a chronological amount $\tau$. The amount $\tau$ corresponds precisely to the amount of the runtime delay of quantizer Q, i.e., the amounts of the delay times are adapted to one another through suitable selection of the weighting factor in weighted adder GA, resulting in a compensation of the undesired runtime effects. As shown in FIG. 2, rectangular output signal U5 has twice the frequency of input signal U1, whereby in addition the output signal has an undistorted symmetrical impulse-pause ratio of 1 to 1. In particular, no phase shift of output signal U5 in relation to input signal U1 takes place.

Figure 3:
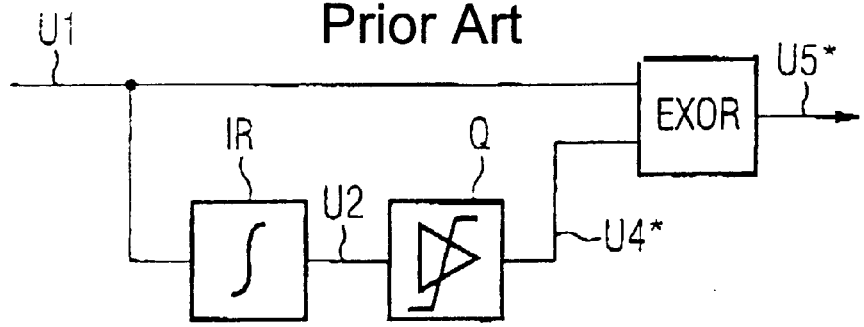
FIG. 3 is a block circuit diagram of a conventional frequency doubling circuit.

FIG. 3 shows a frequency doubling circuit according to the prior art as already described above. This circuit likewise has an integrator IR with a downstream quantizer Q, whereby integrated and quantized signal U4* is combined with input signal U1 in an exclusive OR gate, and can be derived at the output as frequency-doubled signal U5*.

Figure 4:
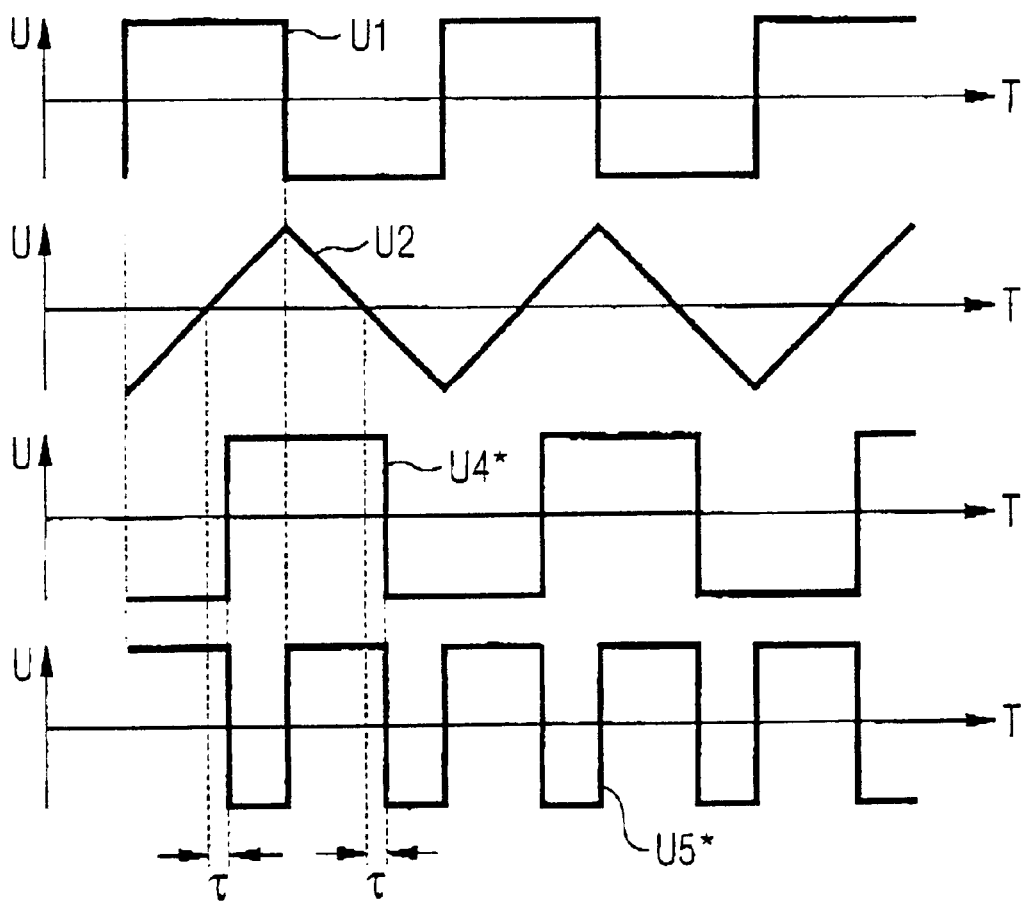
FIG. 4 is graph for illustrating the voltage curves of the signals of the frequency doubling circuit of FIG. 3.

FIG. 4, which illustrates the temporal courses of the voltages U of signals U1, U2, U4*, U5* of the circuit according to FIG. 3, shows the disadvantageous distortion of the impulse-pause ratio of output signal U5* in the prior art. This distortion is caused by runtime effects in the quantizer Q, which have the result that quantized signal U4* includes zero transitions, time-delayed by an amount $\tau$, both in the rising and in the falling edge in relation to integrated signal U2, which is present at the input side at quantizer Q. As a consequence, the two signals U1, U4*, which are present at the input side of the exclusive OR gate EXOR, are not, as desired, phase-shifted by 90° to one another.

In addition to the described weighting of input signal U1 in the weighted adder GA, other signal weightings are also conceivable; for example, only integrated signal U2 may be weighted, or both integrated signal U2 and also input signal U1 may be weighted with different weighting factors. Besides the runtime effects of quantizer Q, additional runtime effects that may occur in the frequency doubling circuit, caused for example by an exclusive OR gate, can thereby also be compensated.

I claim:

1. A frequency doubling circuit, comprising:

an integrator configured to receive an input signal having a first frequency, said integrator having an integrator output and providing an integrated signal at said integrator output;

an adder connected to said integrator and configured to receive the input signal and the integrated signal, said adder having an adder output and providing a summed signal at said adder output;

a quantizer connected to said adder and having a quantizer output, said quantizer receiving the summed signal, deriving a quantized signal from the summed signal and providing the quantized signal at said quantizer output; and an exclusive OR gate having a first input, a second input and an output, said exclusive OR gate receiving the input signal at said first input and receiving the quantized signal at said second input, and providing an output signal having a second frequency, the second frequency being double the first frequency.

2. The frequency doubling circuit according to claim 1, wherein said adder has a weighting unit for generating a weighted input signal, and said adder forms the summed signal from the weighted input signal and the integrated signal.

3. The frequency doubling circuit according to claim 1, wherein said integrator is an RC low-pass filter.

4. The frequency doubling circuit according to claim 1, wherein said quantizer is a limiting amplifier.

5. The frequency doubling circuit according to claim 1, wherein said quantizer provides a logical one at said quantizer output if a voltage of the summed signal is at least zero, and provides a logical zero if the voltage of the summed signal is less than zero.

6. The frequency doubling circuit according to claim 2, wherein said weighting unit weights the input signal such that zero transitions of the summed signal are shifted for compensating runtime effects in said quantizer.

7. The frequency doubling circuit according to claim 2, wherein said weighting unit weights the input signal such that zero transitions of the summed signal are shifted for compensating a sum of runtime effects in said integrator, in said quantizer, and in said exclusive OR gate.

* * * * *